(12) United States Patent
Cartier et al.

(10) Patent No.: US 8,592,047 B2
(45) Date of Patent: Nov. 26, 2013

(54) BINDER BASED ON CARBOXYLIC ACID VINYL ETHYLENE ESTER COPOLYMER AND POLYOLEFIN CONTAINING A FUNCTIONAL MONOMER

(75) Inventors: Laurent R. Cartier, Wayne, PA (US); Olivier Collas, Saint Pierre de Salerne (FR); Catherine Corfias-Zuccalli, Pont-Audemer (FR); Samuel Devisme, Rouen (FR)

(73) Assignee: Arkema France, Colombes (FR)

( * ) Notice: Subject to any disclaimer, the term of this patent is extended or adjusted under 35 U.S.C. 154(b) by 517 days.

(21) Appl. No.: 12/867,129

(22) PCT Filed: Feb. 13, 2009

(86) PCT No.: PCT/FR2009/050229
§ 371 (c)(1),
(2), (4) Date: Oct. 29, 2010

(87) PCT Pub. No.: WO2009/101369
PCT Pub. Date: Aug. 20, 2009

(65) Prior Publication Data
US 2011/0033714 A1    Feb. 10, 2011

Related U.S. Application Data

(60) Provisional application No. 61/033,452, filed on Mar. 4, 2008.

(30) Foreign Application Priority Data

Feb. 13, 2008   (FR) ..................................... 08 50908

(51) Int. Cl.
*B32B 27/30*   (2006.01)
*B32B 27/32*   (2006.01)

(52) U.S. Cl.
USPC ........... 428/520; 428/442; 428/463; 428/516; 428/522; 525/191; 525/221; 525/222

(58) Field of Classification Search
USPC .......... 428/442, 463, 516, 520, 522; 525/191, 525/221, 222
See application file for complete search history.

(56) References Cited

U.S. PATENT DOCUMENTS

| | | | |
|---|---|---|---|
| 4,087,588 A | 5/1978 | Shida | |
| 4,774,144 A | 9/1988 | Jachec | |
| 5,053,457 A | 10/1991 | Lee | |
| 5,759,698 A | 6/1998 | Tanuma | |
| 6,414,236 B1 | 7/2002 | Kataoka et al. | 136/251 |
| 7,029,735 B2 | 4/2006 | Flat et al. | 428/35.7 |
| 7,270,862 B2 | 9/2007 | Flat et al. | 428/35.7 |
| 7,767,760 B2 * | 8/2010 | Chou | 525/207 |
| 8,084,129 B2 * | 12/2011 | Chou | 428/412 |
| 2003/0194566 A1 | 10/2003 | Corzani | |
| 2005/0069710 A1 | 3/2005 | Bonnet et al. | 428/411.1 |
| 2006/0014900 A1 | 1/2006 | McFaddin | |
| 2006/0165929 A1 | 7/2006 | Lenges et al. | 428/35.7 |
| 2007/0111009 A1 | 5/2007 | Morris | |
| 2008/0032148 A1 | 2/2008 | Lee | |

FOREIGN PATENT DOCUMENTS

| | | |
|---|---|---|
| WO | WO 2006/093936 | 9/2006 |
| WO | WO-2007079092 A1 | 7/2007 |
| WO | WO-2010060064 A1 | 5/2010 |

OTHER PUBLICATIONS

"Lotader 3210", Pamphlet on Lotader® 3210 (Jul. 2004), 2 pgs.
"Lotader 4700", Pamphlet on Lotader® 4700 (Jul. 2004), 2 pgs.
"Lotader AX8840", Pamphlet on Lotader® AX8840 (Jul. 2004), 2 pgs.
Leclere, Igor N., "*Keys to Good Adhesion in Coextrusion Coating: Interactions Between Tie Resin Nature and Pre-Treatments*", 1997 Polymers, Laminations & Coatings Conference, 203-212.
Notice of Opposition to European Patent No. 2242647, dated Aug. 29, 2012.

\* cited by examiner

*Primary Examiner* — D. S. Nakarani
(74) *Attorney, Agent, or Firm* — RatnerPrestia

(57) ABSTRACT

The invention relates to a binding agent comprising a mixture of a carboxylic acid vinyl ethylene ester copolymer (A) and a polyolefin (B) containing a functional monomer (X), the mass ratio B/(A+B) being between 0.05 and 1. Said binder has very good adhesion properties for adhering to a number of supports in photovoltaic modules, in addition to satisfactory transparency and electrical resistivity properties for the advantageous use of the binder in said module.

10 Claims, No Drawings

BINDER BASED ON CARBOXYLIC ACID VINYL ETHYLENE ESTER COPOLYMER AND POLYOLEFIN CONTAINING A FUNCTIONAL MONOMER

FIELD OF THE INVENTION

The present invention relates to a tie, based on an ethylene/carboxylic acid vinyl ester copolymer and on a polyolefin, having adhesive properties.

More particularly, this tie may advantageously be used as an encapsulant in photovoltaic modules.

PRIOR ART

Ties composed of an ethylene/vinyl ester copolymer are known which enable the adhesion to certain polymer materials (such as, for example, polyethylene or polystyrene), or else metals. These ties have the advantage of being inexpensive, transparent and easy to use. Among the copolymers of this type, mention may be made of ethylene/vinyl acetate copolymers (EVA). They are found in numerous fields, such as, for example, those of solar panels (also known as "photovoltaic modules") or of laminated glass.

However, the adhesion to certain supports (glass, polymethyl methacrylate (PMMA)) is insufficient for certain applications.

In particular, in the field of photovoltaic modules, EVA is used as a tie in order to "encapsulate" the photovoltaic cells. These photovoltaic cells are generally joined together by metal wires. The EVA-based tie has properties of adhesion to the metal and to the silicon crystals, which makes it possible to prevent the cell from coming into contact with the dioxygen in the air and to limit the corrosion thereof. It then has the role of an "encapsulant". These encapsulated photovoltaic cells are situated on a lower protective support of the module (known as a "back sheet"), whose main role is to protect the photovoltaic cells from moisture. This back sheet may be formed from a structure of the multilayer fluoropolymer/polyethylene terephthalate/fluoropolymer type or fluoropolymer/polyethylene terephthalate/EVA type. A sheet of glass or of a transparent polymer is applied to the other side of the tie in order to protect the cell from impacts and external moisture, this upper protective layer commonly being known as the "front sheet". If the encapsulant does not adhere sufficiently to the various supports of the structure (cells, back sheet, front sheet), the presence of moisture or of air in contact with the cells and the tie occurs inside the solar panel, which causes its accelerated aging by damaging the cells and by delamination at the back sheet/encapsulant interface or the encapsulant/front sheet interface.

Similarly, in the case of laminated glass, EVA can serve as a tie between the sheets of glass. A delamination of the sheets may be observed over time when pure EVA is used.

Furthermore, these ties composed of EVA have little adhesion with PMMA. However, for solar panels, it is possible to replace the protective layer made of glass with a sheet of PMMA.

It is also possible, in the case of laminated glass, that at least one of the layers be made of PMMA, in order to allow, for example, the production of coloured structures by addition of organic pigments into the bulk of the PMMA layer.

To solve these bonding problems, coupling agents are often mixed with the EVA-based tie. These agents, which will allow the adhesion between the tie and the support to be improved, are products chosen from organic titanates or silanes. During the implementation of the solar panels, the components are assembled by laminating, and the panel is drawn under vacuum via a silicone membrane. However, this silicone membrane has a tendency to degrade in contact with these coupling agents; it is therefore necessary to limit the use thereof. This is a major problem for the manufacturers of photovoltaic modules at the present time since these silicone membranes are expensive and it is necessary to shut down production for the time it takes to replace them. Furthermore, coupling agents have a tendency to hydrolyse in contact with moisture and to lose their activity over time.

Furthermore, in the case of PMMA, the effect of these coupling agents is very weak, which does not make it possible to ensure a sufficient adhesion for its use in the fields of solar panels and laminated glass.

Alternative solutions to these EVA ties have already been described in the prior art.

Application WO 2006/093936 describes an encapsulant whose ageing behaviour is improved by the addition of absorbents in order to increase the lifetime of the solar panels. It does not relate to the improvement of the adhesion between the various components of the panel.

Application US 2006/0165929 describes a multilayer structure comprising at least 3 layers, the inner layer being a polymer layer sandwiched between two ionomer layers. This structure serves as a tie with a glass support. However, this tie requires the production of a three-layer structure, which makes the manufacturing process more complex and increases the production costs.

U.S. Pat. No. 6,414,236 describes a tie composed of an ethylene/unsaturated fatty acid ester/unsaturated fatty acid terpolymer. This tie makes it possible to obtain a better heat and moisture ageing resistance.

In Patent Application US 2005/0069710 by the Applicant, a multilayer film is described that is useful for coating substrates, this film being composed of one layer of a blend of a fluoropolymer and a functionalized polymer which may be functionalized PMMA, adhering to a tie layer formed from an ethylene/(meth)acrylate/epoxide copolymer. This tie only adheres to the layer of the blend when the PMMA is functionalized. Furthermore, the pressing must be carried out at high temperature and pressure (240° C., 40 MPa) in order to give rise to the adhesion, which may lead to a thermal degradation of the various components of the support, and also their deformation. For example, this temperature prevents the use of coupling agents which may lead to degassing at this temperature.

In order for the tie to be able to be used in photovoltaic modules and in particular as an encapsulant of solar cells, it is advantageous for this tic to have good transparency properties. Indeed, when the solar radiation is not reduced very much as it passes through the layers covering the solar cells, the efficiency of the encapsulated solar cells is higher.

Preferably, a transparent tie has a degree of haze less than or equal to 10%, this degree of haze being evaluated according to the ASTM D1003 standard, on a 500 µm thick film of said tie and for at least one wavelength in the visible range (from 380 to 780 nm).

It is also preferable that the electrical resistivity of the tie is sufficiently high. When the resistivity is high, it is possible to reduce the thickness of the encapsulating film without risking a short-circuit of the photovoltaic module.

Advantageously, the tie has an electrical volume resistivity greater than or equal to $10^{14}$ ohm·cm when this resistivity is measured at 23° C. on a 100 µm film and at a frequency of 0.01 Hz.

It is therefore necessary to develop a tie that makes it possible to combine supports that have very different chemical natures and surface energies (glass, plastics, metals, silicon crystals, etc.) and that solve the aforementioned problems.

SUMMARY OF THE INVENTION

The objective of the present invention is to provide a tie which may take the form of a single-layer film, and which displays, relative to conventional EVA-based ties, an improved adhesion to supports as diverse as glass, metals, silicon crystals, or else polymer materials, and in particular with functionalized or unfunctionalized PMMA. Preferably, the manufacture of the tie of the invention is more economical than the aforementioned solutions.

According to the invention, a tie comprises a blend of an ethylene/carboxylic acid vinyl ester copolymer (A) and a polyolefin (B) which contains a functional monomer (X). The B/(A+B) weight ratio is preferably within the range of 0.05 to 1, for instance between 0.05 and 1 and more preferably between 0.05 and 0.5.

The blend of these two polymers allows the formation of a tie which, while being able to form a single-layer film, has properties of adhesion to supports as diverse as glass, metals, silicon crystals, or else polymer materials, and in particular PMMA.

More particularly, the invention relates to the use of this tie in photovoltaic modules, in particular as an encapsulant of photovoltaic cells. Another advantage of this tie is that it has a good adhesion, even without coupling agents such as silanes being used.

Furthermore, the tie adheres to the various supports of the photovoltaic module, even when this tie is press-molded at low temperature and/or under reduced pressure. The expression "low temperature" is understood to mean a temperature advantageously of less than 160° C., or even 150° C. The expression "reduced pressure" is understood to mean a pressure preferably of less than 10 MPa.

Furthermore, this tie has a transparency and an electrical resistivity that enable it to be advantageously used as an encapsulant in photovoltaic modules.

According to the embodiment of the invention where (B)/((A)+(B)) is equal to 1, the composition does not comprise an ethylene/carboxylic acid vinyl ester copolymer (A).

Advantageously, the B/(A+B) weight ratio is between 0.05 and 0.4, and preferably between 0.15 and 0.4.

This tie additionally has a price/performance compromise which makes it economically profitable.

It is specified that, in the present description of the invention, when the polymer, that is to say the copolymer (A) or the polyolefin (B), comprises a monomer, it means that this monomer is in polymerized form in the polymer.

It is possible, for example, to measure the amounts of each monomer to be used within the polyolefin (B) and the copolymer (A) by using known techniques of Fourier transform infrared spectroscopy and the ISO 8985 standard.

Regarding the polyolefin (B), it is a polymer that comprises, as monomer, an α-olefin.

Preferably, the α-olefin is ethylene.

According to a first embodiment, the functional monomer (X) is grafted to the polyolefin (B).

According to a second embodiment, the functional monomer (X) is copolymerized in the chain of the polyolefin (B).

The amount of the functional monomer (X) contained in the polyolefin (B) is preferably between 0.05 and 10 wt %, whether this monomer is grafted or copolymerized.

Such a functional monomer (X) contained in the polyolefin (B) is advantageously maleic anhydride.

One of the preferred ties of the invention comprises an ethylene/alkyl(meth)acrylate/maleic anhydride copolymer as the functional polyolefin (B).

Another most particularly preferred tie of the invention comprises an ethylene/vinyl acetate/maleic anhydride copolymer as the functional polyolefin (B).

The polyolefin (B) may also comprise an unsaturated epoxide as the functional monomer (X), this preferably being glycidyl methacrylate. By way of example of polyolefin (B) comprising glycidyl methacrylate, mention may be made of ethylene/glycidyl methacrylate copolymers or ethylene/alkyl (meth)acrylate/glycidyl methacrylate copolymers.

When the polyolefin (B) comprises an unsaturated epoxide, the resistivity of the composition and its transparency are excellent. The adhesion is particularly improved with supports of the type: glass, PMMA or back sheet conventionally used in photovoltaic modules. These particularly preferred ties are thus of use as encapsulants.

Advantageously, the copolymer (A) is an ethylene/vinyl acetate copolymer.

The carboxylic acid vinyl ester content in the copolymer (A) is advantageously between 15 and 60 wt % of vinyl ester and more preferably between 25 and 45 wt %.

According to the invention, the composition may take the form of a film. In the vinyl ester ranges of the copolymer (A) above, the film has even better adhesion properties and the forming thereof, by known processing methods, is facilitated.

Similarly, it is advantageous that the tie have a Melt Flow Index (MFI) between 1 to 400 g/10 min (ASTM D 1238—190° C./2.16 kg) preferably from 40 to 300 g/10 min. A person skilled in the art will easily be able to manufacture this tie by choosing the polymers (A) and (B) that have a suitable molar mass and a suitable comonomer content or by modifying the B/(A+B) weight ratio. The tie has, in this melt flow index range, a greater adhesivity while being able to be extruded in the form of a film by conventional extrusion-blow moulding, extrusion-lamination, extrusion-coating, calendering or cast extrusion techniques. Preferably, extrusion-blow moulding, cast extrusion or calendering is used to form the film according to the invention. A person skilled in the art could easily determine the operating conditions of these extrusion techniques (temperature in the extruder, rotational speed of the screws, roller speed) in order to be able to form a film from the tie of the invention.

When the composition takes the form of a film, its thickness is preferably between 50 μm and 2000 μm.

The tie may additionally contain additives, such as for example a crosslinking agent, a coupling agent or an ultraviolet (UV) stabilizer or else colorants.

The present invention also relates to a multilayer structure comprising a tie such as defined previously and at least one support made of glass, of polymer, of metal or of silicon crystals, the tie being in direct contact with the support.

In another preferred structure, at least one support is made of PMMA.

Surprisingly, although the glass and PMMA surfaces have very different surface properties, the tie bonds to both supports. This polyvalency is one of the advantages of the invention, without which it would be necessary to carry out a surface pre-treatment of the supports.

The invention also relates to a process for manufacturing a multilayer structure obtained from a tie film according to the invention.

Another subject of the invention is the use of the tie for manufacturing solar panels, in particular as an encapsulant of photovoltaic cells. Another subject of the invention is a photovoltaic module comprising this tie.

Finally, the invention also relates to the use of the structures of the invention for manufacturing solar panels or laminated glass.

DETAILED DESCRIPTION OF THE INVENTION

The tie of the present invention comprises a blend of an ethylene/vinyl ester copolymer (A) and a polyolefin (B) which contains a functional monomer (X), the B/(A+B) weight ratio being between 0.05 and 1, preferably less than 1, and more preferably between 0.05 and 0.5.

Regarding the polyolefin (B), this is a polymer comprising an α-olefin as monomer.

The α-olefins that have 2 to 30 carbon atoms are preferred.

As an α-olefin, mention may be made of ethylene, propylene, 1-butene, 1-pentene, 3-methyl-1-butene, 1-hexene, 4-methyl-1-pentene, 3-methyl-1-pentene, 1-octene, 1-decene, 1-dodecene, 1-tetradecene, 1-hexadecene, 1-octadecene, 1-eicosene, 1-docosene, 1-tetracosene, 1-hexacosene, 1-octacosene, and 1-triacontene. Ethylene is preferred as the α-olefin.

This polyolefin may be a homopolymer when a single α-olefin is polymerized in the polymer chain. Mention may be made, as examples, of polyethylene (PE) or polypropylene (PP).

This polyolefin may also be a copolymer when at least two comonomers are copolymerized in the polymer chain, one of the two comonomers referred to as the "first comonomer" being an α-olefin.

As the second comonomer, mention may be made of:
one of the α-olefin already mentioned, the latter being different from the first α-olefin comonomer;
dienes such as, for example, 1,4-hexadiene or ethylidene norbornene;
unsaturated carboxylic acid esters such as, for example, the alkyl acrylates or alkyl methacrylates grouped under the term alkyl(meth)acrylates. The alkyl chains of these (meth)acrylates may have up to 30 carbon atoms, advantageously from 1 to 12 carbon atoms, and preferably from 1 to 6 carbon atoms. Mention may be made, as alkyl chains, of methyl, ethyl, propyl, n-butyl, sec-butyl, isobutyl, tert-butyl, pentyl, hexyl, heptyl, octyl, 2-ethylhexyl, nonyl, decyl, undecyl, dodecyl, tridecyl, tetradecyl, pentadecyl, hexadecyl, heptadecyl, octadecyl, nonadecyl, eicosyl, henicosyl, docosyl, tricosyl, tetracosyl, pentacosyl, hexacosyl, heptacosyl, octacosyl, nonacosyl. Methyl, ethyl and butyl (meth)acrylates are preferred as unsaturated carboxylic acid esters; and
carboxylic acid vinyl esters. As examples of carboxylic acid vinyl esters, mention may be made of vinyl acetate, vinyl versatate, vinyl propionate, vinyl butyrate or vinyl maleate. Vinyl acetate is preferred as the carboxylic acid vinyl ester.

It will not be outside the scope of the invention if various "second comonomers" were copolymerized in the polyolefin (B).

In the context of the present invention, the polyolefin (B) contains at least one functional monomer (X).

As functional monomer (X) contained in the polyolefin (B), mention may be made of:
unsaturated epoxides. Among the latter, these are, for example, aliphatic glycidyl esters and ethers such as allyl glycidyl ether, vinyl glycidyl ether, glycidyl maleate and itaconate, glycidyl acrylate and methacrylate. These are also, for example, alicyclic glycidyl esters and ethers such as 2-cyclohex-1-ene glycidyl ether, diglycidyl 4,5-cyclohexenecarboxylate, glycidyl 4-cyclohexenecarboxylate, glycidyl 5-norbornene-2-methyl-2-carboxylate and diglycidyl endocis-bicyclo[2.2.1]hept-5-ene-2,3-dicarboxylate;
unsaturated carboxylic acids and salts thereof, for example acrylic acid or methacrylic acid and the salts of these same acids; and
carboxylic acid anhydrides. They may be chosen, for example, from maleic, itaconic, citraconic, allylsuccinic, 1,2-cyclohex-4-enedicarboxylic, 4-methylene-1, 2-cyclohex-4-enedicarboxylic, bicyclo[2.2.1]hept-5-ene-2,3-dicarboxylic and x-methylbicyclo[2.2.1]hept-5-ene-2,2-dicarboxylic anhydrides.

It is preferred to use glycidyl methacrylate.

It is also preferred to use maleic anhydride as the functional monomer (X).

The functional monomer (X) may be copolymerized in the chain of the polyolefin (B) by an autoclave or tubular reactor process, or/and be grafted to the polyolefin (B). The polymerization, by an autoclave or tubular reactor process, of the various monomers (α-olefin, comonomer(s)) with the functional monomer (X) is known to a person skilled in the art. Similarly, the grafting is an operation that is known per se.

The polyolefin (B) containing the functional monomer (X) would be in accordance with the invention if several different functional monomers (X) were copolymerized or/and grafted.

It would not be outside the scope of the invention if the polyolefin (B) containing a functional monomer (X) is composed of a blend of polyolefins (B) of which at least one contains a copolymerized and/or grafted functional monomer (X).

According to a first embodiment, where the polyolefin (B) is grafted by a functional monomer (X), as the polyolefin (B) containing a functional monomer (X), ethylene/alkyl(meth)acrylate copolymers grafted by the monomer (X) are particularly preferred. The alkyl chain may preferably have up to 9 carbon atoms. These copolymers advantageously comprise up to 50 wt % of (meth)acrylate and preferably between 25 and 45 wt %.

Even more particularly, ethylene/carboxylic acid vinyl ester copolymers grafted by the monomer (X) are preferred as the polyolefin (B) containing a functional monomer (X). These copolymers advantageously comprise up to 50 wt % of vinyl ester and preferably between 25 and 45 wt %.

According to a second embodiment, where the functional monomer (X) is copolymerized in the polyolefin (B), it is preferred to use, as the polyolefin (B) containing a functional monomer (X), the ethylene/alkyl(meth)acrylate/maleic anhydride copolymers obtained by copolymerization of the three comonomers. The alkyl chain may preferably have up to 9 carbon atoms. These copolymers advantageously comprise up to 50 wt % and preferably between 25 and 45 wt % of alkyl(meth)acrylate and advantageously between 0.05 and 10 wt % of maleic anhydride.

More preferably still, it is preferred to use, as the polyolefin (B) containing a functional monomer (X), the ethylene/vinyl acetate/maleic anhydride copolymers obtained by copolymerization of the three comonomers, these copolymers advantageously comprising up to 50 wt % and preferably between 25 and 45 wt % of (meth)acrylate, advantageously between 0.05 and 10 wt % and preferably between 0.05 and 2 wt % of maleic anhydride.

Another exemplary embodiment where the functional monomer (X) is copolymerized in the polyolefin (B) is a copolymer comprising an unsaturated epoxide (X), for example glycidyl methacrylate. This polyolefin preferably comprises, relative to the total weight of the polyolefin (B), from 70% to 99.9% by weight of α-olefin and from 0.1% to 30% by weight of unsaturated epoxide (X). This polyolefin (B) may be an ethylene/glycidyl methacrylate copolymer.

The polyolefin (B) may also be an α-olefin/alkyl (meth) acrylate/glycidyl methacrylate copolymer. This polyolefin preferably comprises, relative to the total weight of the polyolefin (B), from 45% to 84.9% by weight of α-olefin, from 15% to 35% by weight of alkyl(meth)acrylate and from 0.1% to 20% by weight of unsaturated epoxide (X). The α-olefin is preferably ethylene.

As regards the ethylene/carboxylic acid vinyl ester copolymer (A), mention may be made of the same carboxylic acid vinyl esters as those described above as the second comonomer when (B) is a copolymer. The ethylene/vinyl acetate copolymer is preferred.

The tie may also comprise at least one additional polymer different from the polyolefin (B) and optionally from the copolymer (A) and in particular at least one additional polyolefin. As examples of additional polyolefins, mention may be made, non-limitingly, of polyethylene, polypropylene or copolymers of ethylene such as the ethylene/alkyl(meth) acrylate copolymer.

The copolymer (A) and/or the polyolefin (B) are preferably random polymers. They are advantageously obtained by high-pressure polymerization of the monomers with processes known to a person skilled in the art. This polymerization is carried out for example in a tubular reactor or autoclave. Copolymerization processes that can be used are, for example, those described in U.S. Pat. No. 4,788,265 and patent applications US2006/0149004A1, US2007/0032614 A1, FR2660660, FR2498609, FR2569411 and FR2569412. The polyolefins included in the tie of the invention may also be synthesized by catalysis methods known to a person skilled in the art, such as Ziegler-Natty catalysis or metallocene catalysis. The expression "metallocene catalysis" is understood to mean a single-site catalyst generally composed of a zirconium or titanium atom and two cyclic alkyl molecules coordinated to the metal. More specifically, the metallocene catalysts are usually composed of two cyclopentadiene rings coordinated to the metal. These catalysts are frequently used with aluminoxanes, preferably methylaluminoxane (MAO), as cocatalysts or activators. Hafnium may also be used as the metal to which the cyclopentadiene is attached. Other metallocenes may include transition metals from groups IV A, V A, and VI A. Metals from the lanthanide series may also be used. The expression "polyolefins obtained by single-site metallocene catalysis" is understood to mean polyolefins having a polydispersity index below 3, the polydispersity index being defined by the ratio of the weight-average molecular weight $M_w$ to the number-average molecular weight $M_n$ ($M_w/M_n$ ratio).

The tie according to the invention may essentially comprise polyolefins as polymers, for example it may comprise more than 90% of polyolefins relative to the total weight of the polymers of the tie, or even more than 95%, or it may be constituted of polyolefins as polymers of the tie.

The tie may also comprise additives, in particular those conventionally used in photovoltaic panels. By way of example, mention may be made of crosslinking agents, coupling agents, UV stabilizers, fillers and plasticizers, flame retardants could also be added or colouring or brightening compounds.

Among the crosslinking agents, mention may be made of isocyanates or organic peroxides. This crosslinking makes it possible to improve the thermal stability of the tie, in particular its creep resistance and also the adhesion with the support.

These properties are particularly important when the tie is involved in the formation of laminated glass or solar panels.

Even if the composition may not comprise coupling agents, the organic titanates or silanes are examples of coupling agents which may be added in order to improve the adhesion when the latter must be particularly high. Among these, mention may be made of monoalkyl titanates or trichlorosilanes and trialkoxysilanes.

Since UV radiation leads to yellowing of the film, UV stabilizers may be added in order to guarantee the transparency of the film during its lifetime. The compounds may be, for example, based on benzophenone or benzotriazole.

Fillers, in particular mineral fillers, may be added to improve the thermomechanical strength of the composition. Non-limitingly, silica, alumina, talc or calcium carbonates or carbon nanotubes will be given as examples. Advantageously, modified or non-modified clays, which are mixed on a nanoscale, are used; this makes it possible to obtain a more transparent composition.

Plasticizers may be added in order to facilitate processing and improve the productivity of the manufacturing process of the composition and of the structures. Mention may be made, as examples, of paraffinic, aromatic or naphthalenic mineral oils. Mention may also be made, as a plasticizer, of phthalates, azelates, adipates, and tricresyl phosphate.

Flame retardants may also be added.

It is also possible to add colouring or brightening compounds.

The MFI of the binder (ASTM D 1238—190° C./2.16 kg) may be between 0.1 and 1000 g/10 min. Advantageously, this tie has an MFI between 1 and 400 g/10 min: the adhesion is further improved, while still being able to obtain a film of the tie of the invention by the conventional techniques of extrusion-lamination, extrusion-blow moulding, etc. In this film form, the manufacture of multilayer structures is permitted by simple assembly of the layers before pressing.

The ties of the invention are very polyvalent and make it possible to obtain adhesion to supports that have very different chemical natures or surface energies. Among the supports, mention may be made of:

glass;

metal;

polymers such as PMMA, EVA, PE or PP;

single-crystal or polycrystalline silicon crystals; and the back sheet of a solar panel. Mention may be made, as examples of a back sheet, of fluoropolymer/PET/fluoropolymer multilayers whose surface has been treated or fluoropolymer/PET/EVA multilayers. The area of contact between the tie and the back sheet is respectively the fluoropolymer whose surface has been treated or EVA.

In order to treat the surface of the back sheet, it is possible to use a material such as a primer layer in order to improve the adhesion to the tie. Among the primers, mention may be made of thermoplastic polyurethanes, polyesters, organosilanes or else silicones. The ties of the invention also have a very good adhesion to these primers. The back sheet may also be treated by a plasma treatment such as, for example, a corona treatment.

As examples of front sheets, mention may be made of sheets of glass or sheets or films of a transparent polymer such as, for example, PMMA, polyamide or fluoropolymers.

It is possible to use any type of photovoltaic cells for manufacturing the photovoltaic modules according to the invention. It is possible, for example, to use cells known as "conventional cells" based on monocrystalline or polycrystalline doped silicon; thin-film cells formed, for example, from amorphous silicon, cadmium telluride, copper indium diselenide or organic materials may also be used to capture solar energy.

The photovoltaic modules comprising the ties according to the invention may be manufactured by known techniques. For example, it is possible to use the composition in the form of a film. This film may be used as an encapsulant of photovoltaic cells. In order to manufacture a module, it is possible to assemble successively, on a first front sheet layer, a first layer of encapsulant, the photovoltaic cells, a second layer of encapsulant then a back sheet layer.

The photovoltaic module may be formed, for example, by hot pressing or vacuum pressing, by lamination and in particular thermolamination. Vacuum pressing is particularly preferred. This tie is particularly suitable for thermolamination as it can be applied at low temperature (below 160° C., even 150° C.).

A process for manufacturing this module comprises a step of crosslinking the layer of encapsulant after assembling the various layers.

Preferably, the ties of the invention have an adhesion to the glass of at least 10 N/15 mm in the 90° peel test according to the ISO 8510-1 standard.

Preferably, the ties of the invention have an adhesion to the PMMA of at least 10 N/15 mm in the 90° peel test according to the ISO 8510-1 standard.

The layers of the multilayer may be formed, for example, by hot pressing or vacuum pressing, by lamination and in particular thermolamination. Vacuum pressing is particularly preferred. This tie is particularly suitable for thermolamination as it can be applied at low temperature (below 160° C., even 150° C.).

EXAMPLES

In order to formulate the examples of the invention and the comparative examples, the following products were used:

EVATANE® 28-150: This is an ethylene/vinyl acetate copolymer manufactured by Arkema whose vinyl acetate content is 28 wt % of vinyl acetate and whose MFI (ASTM D 1238—190° C./2.16 kg) is 150 g/10 min.

EVATANE® 33-45: Ethylene/vinyl acetate copolymer manufactured by Arkema whose vinyl acetate content is 33 wt % of vinyl acetate and whose MFI (ASTM D 1238—190° C./2.16 kg) is 45 g/10 min.

OREVAC® TERPOLYMER 9305: Ethylene/vinyl acetate/maleic anhydride copolymer manufactured by Arkema whose vinyl acetate content is 28 wt % and the maleic anhydride content is 0.8 wt %, the MFI (ASTM D 1238—190° C./2.16 kg) being 180 g/10 min.

LOTADER® 7500: ethylene/ethyl acrylate/maleic anhydride copolymer produced by Arkema, whose ethyl acrylate content is 17% by weight and maleic anhydride content is 2.8%, the MFI (ASTM D 1238—190° C./2.16 kg) being 70 g/10 mill.

LOTADER® 4700: ethylene/ethyl acrylate/maleic anhydride copolymer produced by Arkema, whose ethyl acrylate content is 29% by weight and maleic anhydride content is 1.3%, the MFI (ASTM D 1238—190° C./2.16 kg) being 7 g/10 min.

LOTADER® AX 8950: ethylene/methyl acrylate/glycidyl methacrylate copolymer produced by Arkema, whose methyl acrylate content is 19% by weight and glycidyl methacrylate content is 9%, the MFI (ASTM D 1238—190° C./2.16 kg) being 85 g/10 min.

LUPEROX® TBEC: organic peroxide composition comprising OO-tert-butyl and O-(2-ethylhexyl) peroxycarbonate.

Coupling agent: silane

LACQTENE® 1020 FN 24: Low-density PE manufactured by Total Petrochemicals whose MFI is 2.1 g/10 min (ASTM D 1238—190° C./2.16 kg).

ALTUGLAS® V825HID: PMMA sheets manufactured by Altuglas having a thickness of 3.2 mm and whose Vicat softening point is 111° C. (ASTM D 1525, mode A, 1 kg) and whose flexural modulus is 3200 MPa at ambient temperature (ASTM D 790).

Glass: 3 mm sheets

Back sheet film: PVDF/PET/PVDF.

Formulations without Crosslinking Agent

Low-Density PE/Tie/Glass or PMMA Structures

The degrees of adhesion between the tie according to the invention and the comparative tie and a layer of glass or PMMA were measured here.

Listed in Table 1 are the ties of the invention (EX1, EX2, EX3, EX4) and the comparative ties (CP1, CP2) with the weight ratios of each compound.

TABLE 1

|  | CP1 | CP2 | EX1 | EX2 | EX3 | EX4 | EX5 |
|---|---|---|---|---|---|---|---|
| EVATANE ® 28-150 | 1 | 0 | 0 | 0 | 0 | 0.7 | 0 |
| EVATANE ® 33-45 | 0 | 1 | 0 | 0 | 0 | 0 | 0.7 |
| OREVAC ® Terpolymer 9305 | 0 | 0 | 1 | 0 | 0 | 0.3 | 0.3 |
| LOTADER ® 7500 | 0 | 0 | 0 | 1 | 0 | 0 | 0 |
| LOTADER ® 4700 | 0 | 0 | 0 | 0 | 1 | 0 | 0 |

The compounds of Examples EX3 and EX4 were premixed in a bag before extrusion. In order to measure adhesion, multilayer PE/tie films were coextruded by cast film technology. LDPE was extruded at 50 rpm in a Collin single-screw extruder (screw diameter=45 mm, with a length/diameter ratio=25), the temperatures of the 6 heating zones were 200° C./230° C./240° C./250° C./250° C./250° C. The tie was coextruded at 20 rpm in a Collin single-screw extruder (screw diameter=30 mm, with a length/diameter ratio=25), and the temperatures depended on the intrinsic fluidity of the tie to be coextruded. The temperatures of the 6 heating zones were thus adjusted to 80° C./100° C./100° C./110° C./110° C./110° C. for the Examples CP1, CP2 and EX5, whereas they were adjusted to 60° C./70° C./80° C./80° C./80° C./80° C. for the Examples EX1 to EX4. The two extruders fed a feedblock equipped with a sheet die having a width of 250 mm and a final gap of 500 p.m. The temperature in these devices was set at 230° C. The two-layer film thus produced was drawn from the die outlet in air to a chill roll set at 20° C. at a rate of 4.9 m/min, which allowed the formation of the multilayer film, and the PE and tie layers having respective thicknesses of 200 and 20 μm.

The PE/tie film obtained was pressed against the PMMA or glass support at 110° C. under a pressure of 3 bar for 15 minutes, the tie face being in direct contact with the support. The test piece obtained was cooled to ambient temperature, and its peel strength was measured immediately after manufacture. This was evaluated by a 90° peel test according to the ISO 8510-1 standard.

The peel strength of the examples and comparative examples measured from this test are listed in Table 2.

The transparency of the films obtained (through the degree of haze) and their resistivity were also measured. The formulations CP 2, EX1 and EX5 were extruded in the same COLLIN extruder as that used to extrude the tie with 6 heating zones set at 80° C./100° C./100° C./110° C./110° C./110° C.

Films with a thickness of 100 μm were prepared by pressing the formulations obtained at 120° C. The results are also listed in Table 2.

The haze measurement of the various films was carried out by means of a CM-3610d spectrophotocolorimeter and SpectraMagic NX software for analysis of the results.

For all the films studied, the haze measurement was carried out in transmission mode and in accordance with the ASTM D1003-97 standard.

The electrical volume resistivity was determined at 23° C. using a Novocontrol Concept 40 dielectric spectrometer. The low-frequency (0.01 Hz) resistivity of the samples was recorded when this resistivity is independent of the frequency.

TABLE 2

|  | Support | CP1 | CP2 | EX1 | EX2 | EX3 | EX4 | EX5 |
|---|---|---|---|---|---|---|---|---|
| Peel strength (N/15 mm) | Glass | 3.3 | 0 | 27.3 | 24.5 | 16.5 | 20.2 | 14 |
|  | PMMA | 0.5 | 0.6 | 18.2 | 11.7 | Not measured | 18 | 17.4 |
| Haze |  | Not measured | 16.3 | 3.1 | Not measured | Not measured | Not measured | 1.5 |
| Electrical resistivity (ohm · cm) |  | Not measured | $3.10^{13}$ | $2.10^{15}$ | Not measured | Not measured | Not measured | $2.10^{15}$ |

During the tests, it was observed that there was no rupture of the adhesion between the PE and the tie: thus, the peel strength was only measured between the support and the tie. The EVA ties (CP1 and CP2) display very low peel strengths with the glass and PMMA supports. The ties of the invention have a peel strength that is much higher than that of the conventional EVA-based ties.

The formulation of EX1 shows excellent adhesion of the α-olefin/carboxylic acid vinyl ester/maleic anhydride terpolymer to supports such as glass or PMMA.

Surprisingly, the formulations EX4 and EX5 have peel strengths close to those observed for the polyolefin comprising a functional monomer EX1, even though the weight ratio of EVA is 0.7. Furthermore, irrespective of the fluidity of the tie, the adhesion to PMMA of the ties from EX4 and EX5 is very similar to the tie composed solely of the polyolefin comprising a functional monomer (EX1).

Furthermore, the haze shows that the formulations comprising a polyolefin (B) (EX1 and EX5) are more transparent than the conventional EVA-based formulation (CP2). Surprisingly, the blend of the polyolefin (B) with EVA (EX5) is even more transparent than the polyolefin (B) alone (EX1).

The resistivities of the formulations according to the invention (EX1 and EX5) are higher than that of the EVA-based comparative formulation (CP2).

All these results clearly show the advantage of using the ties according to the invention in photovoltaic modules, in particular as an encapsulant.

Back Sheet/Tie/Glass or PMMA Structures

Other structures were prepared using ties comprising the constituents in the proportions presented in Table 3.

Granules of the various constituents of the formulations of Table 3 are introduced into a WERNER & PFLEIDERER brand internal mixer with a "Z blade", at a temperature of 100° C. and the formulations are mixed at 40 rpm for 10 minutes.

Each formulation is placed between two layers of Teflon in a press at 70° C. at 100 bar for 5 minutes. A 300 μm thick film is obtained.

This film is placed between a back sheet and a sheet of glass and this structure is pressed at 3 bar and 150° C. for 20 minutes.

TABLE 3

|  | CP3 | EX6 | EX7 | EX8 | EX9 |
|---|---|---|---|---|---|
| EVATANE ® 33-45 | 1 | 0 | 0 | 0.7 | 0.7 |
| LOTADER ® 7500 | 0 | 0 | 1 | 0 | 0.3 |
| LOTADER ® AX 8950 | 0 | 1 | 0 | 0.3 | 0 |
| Peel strength (N/15 mm) | 3 | 31 | 22 | 22 | 44 |

These formulations show good adhesion of the formulations according to the invention (EX6 to EX9) with glass supports and back sheets in comparison with formulation CP3.

Formulations with Crosslinking Agent

In order to increase the adhesion in the conventional EVA-based encapsulant formulations, coupling agents are added to these formulations. For the coupling agent to have an effect in these formulations, it is necessary to crosslink the composition. Tie formulations comprising crosslinking agents according to the invention and comparative tie formulations were thus prepared.

The various constituents of the formulations of Table 4 are introduced into a WERNER & PFLEIDERER brand internal mixer with a "Z blade", at a temperature of 100° C. and the formulations are mixed at 40 rpm for 10 minutes.

TABLE 4

|  | CP4 | CP5 | EX10 | EX11 |
|---|---|---|---|---|
| % EVATANE ® 33-45 | 98.5 | 98 | 0 | 69 |
| % OREVAC ® Terpolymer 9305 | 0 | 0 | 98.5 | 29.5 |
| % LUPEROX ® TBEC | 1.5 | 1.5 | 1.5 | 1.5 |
| % Silane | 0 | 0.5 | 0 | 0 |
| Peel strength (N/15 mm) | 5 | 22 | 30 | 39 |
| Creep resistance | No deformation | No deformation | No deformation | No deformation |

Each formulation is placed between two layers of Teflon in a press at 70° C. at 100 bar for 5 minutes. A 300 μm thick film is obtained.

The peel strength and also the creep resistance are measured at 160° C. This creep resistance was determined on IFC (French Institute of Rubber)-type test specimens cut from the films, these films being crosslinked in a press at 3 bar and 150° C. for 20 minutes. The test consists in applying a stress of 0.5 MPa for 15 min by placing samples in an oven at 160° C. and measuring the residual elongation after the return to ambient temperature.

The creep resistance of the formulations is excellent.

In order to measure the adhesion in a structure of photovoltaic module type, the film is placed between a back sheet and a sheet of glass and this structure is pressed at 3 bar and 150° C. for 20 minutes. At the end of this pressing structures are obtained in which the tie is crosslinked.

The examples according to the invention show that the adhesion levels of the formulations according to the invention are excellent.

The invention claimed is:

1. Multilayer structure comprising a layer formed from a tie and at least a support made of PMMA, said tie being in direct contact with the support and comprising a blend of an ethylene/carboxylic acid vinyl ester copolymer (A) and a polyolefin (B) which contains a functional monomer (X) which is maleic anhydride copolymerized in the chain of the polyolefin (B) and/or grafted to the polyolefin (B), the B/(A+B) weight ratio being within the range of 0.05 to 1.

2. The multilayer structure according to claim 1, in which the B/(A+B) weight ratio is between 0.05 and 0.5.

3. The multilayer structure according to claim 1, in which the polyolefin (B) comprises ethylene.

4. The multilayer structure according to claim 1, in which the functional monomer (X) contained in the chain of the polyolefin (B) is copolymerized.

5. The multilayer structure according to claim 1, in which the amount of the functional monomer (X) in the polyolefin (B) is between 0.05 and 10 wt %.

6. The multilayer structure according to claim 1, in which the polyolefin (B) containing a functional monomer (X) is an ethylene/alkyl (meth)acrylate/maleic anhydride copolymer.

7. The multilayer structure according to claim 1, in which the polyolefin (B) containing a functional monomer (X) is an ethylene/vinyl acetate/maleic anhydride copolymer.

8. The multilayer structure according to claim 1, in which the copolymer (A) is an ethylene/vinyl acetate copolymer.

9. The multilayer structure according to claim 1, in which the carboxylic acid vinyl ester content of the copolymer (A) is between 25 and 45 wt %.

10. The multilayer structure according to claim 1, in which the tie has an MFI between 1 and 400 g/10 min (190° C., 2.16 kg).

* * * * *

UNITED STATES PATENT AND TRADEMARK OFFICE
CERTIFICATE OF CORRECTION

| | | |
|---|---|---|
| PATENT NO. | : 8,592,047 B2 | Page 1 of 1 |
| APPLICATION NO. | : 12/867129 | |
| DATED | : November 26, 2013 | |
| INVENTOR(S) | : Laurent B. Cartier et al. | |

It is certified that error appears in the above-identified patent and that said Letters Patent is hereby corrected as shown below:

On the Title Page, Item (75) Inventors, "Laurent R. Cartier" should read -- Laurent B. Cartier --

Signed and Sealed this
Twenty-eighth Day of January, 2014

Michelle K. Lee
*Deputy Director of the United States Patent and Trademark Office*